United States Patent [19]

Boudot et al.

[11] 4,350,558
[45] Sep. 21, 1982

[54] PROCESS FOR THE MANUFACTURE OF POLYCRYSTALLINE GARNET AND CORRESPONDING MONOCRYSTALS

[75] Inventors: Bernard Boudot, Paris; Georges Nury, Frepillon, both of France

[73] Assignee: Rhone-Poulenc Industries, Paris, France

[21] Appl. No.: 204,894

[22] Filed: Nov. 7, 1980

[30] Foreign Application Priority Data

Nov. 9, 1979 [FR] France .................. 79 27658

[51] Int. Cl.$^3$ .......................................... C30B 15/00
[52] U.S. Cl. ................. 156/617 SP; 156/DIG. 63; 23/305 RE; 252/62.57
[58] Field of Search .............. 156/617 SP, DIG. 63; 23/305 RE; 423/263, 593, 600; 252/62.57; 106/42; 75/134 T, 152

[56] References Cited

U.S. PATENT DOCUMENTS

| | | | |
|---|---|---|---|
| 3,386,919 | 6/1968 | Forrat | 156/615 |
| 3,562,175 | 2/1971 | Hickok | 423/263 |
| 3,563,897 | 2/1971 | West | 252/62.57 |
| 3,591,516 | 7/1971 | Rabatin | 23/305 RE |
| 3,681,010 | 8/1972 | Messier et al. | 423/263 |
| 3,681,011 | 8/1972 | Gazza | 23/24 R |
| 3,723,599 | 3/1973 | Brandle, Jr. et al. | 156/DIG. 63 |
| 3,736,106 | 5/1973 | Hamelin et al. | 252/62.57 |
| 3,751,366 | 8/1973 | Bomar, Jr. et al. | 252/62.57 |
| 3,838,053 | 9/1974 | Kestigian | 252/62.57 |
| 3,956,440 | 5/1976 | Deschamps et al. | 252/62.57 |
| 4,115,134 | 9/1978 | Rhodes | 423/263 |

OTHER PUBLICATIONS

Chemical Abstracts, vol. 70, 1969, p. 414, entry 92802j.
Chemical Abstracts, vol. 83, 1975, p. 192, entry 82187s.

Primary Examiner—Gregory N. Clements

[57] ABSTRACT

A process for the manufacture of a polycrystalline garnet containing aluminium and/or gallium and/or indium and at least one element taken from the group comprising the rare earths and yttrium, and to the corresponding monocrystal.

The process comprises the following steps:
(1) a solution containing the salts of the constituent cations of the garnet, in the proportions corresponding to the composition of the latter, is prepared;
(2) corresponding hydroxides are co-precipitated by means of a base in order to obtain a co-hydroxide, the solution of salts and the base being added simultaneously at a temperature between ambient temperature and the boiling point of the solution of salts, in such a way that the pH of the medium is between about 5 and 10 and that, within these limits, it is kept at a constant value throughout the co-precipitation;
(3) if appropriate, the co-hydroxide is left to age;
(4) it is filtered off;
(5) it is washed;
(6) it is dried; and
(7) it is then calcined at a temperature above the temperature for the formation of the desired garnet structure.

The monocrystals obtained by Czochralski drawing of the polycrystalline garnets of the invention can be used, in particular, as substrates in magnetic bubble memory devices.

20 Claims, 4 Drawing Figures

PROCESS FOR THE MANUFACTURE OF POLYCRYSTALLINE GARNET AND CORRESPONDING MONOCRYSTALS

BACKGROUND OF THE INVENTION

The present invention relates to a process for the manufacture of polycrystalline garnet containing aluminium and/or gallium and/or indium and at least one element taken from the group comprising the rare earths and yttrium, the garnet obtained, and the corresponding monocrystals. More especially and preferably, it relates to a process for the manufacture of gadolinium gallium garnet ($Gd_3Ga_5O_{12}$) and to the corresponding monocrystal.

The use of monocrystals having a garnet structure, in particular as substrates for the manufacture of magnetic bubble memory devices, is well known. For this use, the monocrystals of garnet are essentially manufactured by Czochralski drawing of the polycrystalline mixed oxides having the garnet structure, which are hereafter referred to as polycrystalline garnets.

At the present time, polycrystalline garnets are prepared in accordance with three processes.

The first of these processes, described, for example, in *Journal of Crystal Growth*, 12, pp. 3–8 (1972), consists in following a procedure in which the various oxides forming part of the composition of the garnet are mixed in accordance with the following steps:

the various oxides forming part of the composition of the garnet are calcined separately;

the amounts fixed by the formula of the garnet for the various oxides are weighed;

the oxides are mixed mechanically and the mixture obtained is compacted by compression;

the compacted mixture is introduced into the drawing crucible; and the mixture is melted.

This process exhibits essentially two disadvantages. On the one hand, during the heating of the mixture, it is impossible to characterize the garnet structure of the polycrystalline mixture, the appearance of which depends on the temperature increase program used; on the other hand, because of the evaporation of certain subspecies, the composition of the bath at the moment of drawing, as a function of its composition at ambient temperature, can only be known from empirical relationships.

The second of these processes (described, for example, in German Pat. No. 2,615,554) consists in following a procedure in which the various oxides forming part of the composition of the garnet are mixed and then calcined so as to obtain the garnet structure prior to the melting operation. The calcination conditions (temperature and time) are determined as a function of the kinetics of solid-solid reactions, which themselves depend essentially on the physical properties of the oxides used and on the proportions of impurities therein.

This second prior art process is the most commonly used process for the preparation of polycrystalline garnets. Compared with the first prior art process, it permits a better knowledge of the composition of the bath at the moment of drawing, because of the possibility of characterizing the garnet structure. However, this process exhibits the disadvantage that it generally requires lengthy calcinations which, as has been demonstrated, do not always result in complete reactions between the oxides. For example, in the case of a $Gd_3Ga_5O_{12}$ garnet, calcination of a mixture of 3 mols of $Gd_2O_3$ to 5 mols of $Ga_2O_3$ for 100 hours at 1350° C. results in a mixture in which 10 percent by weight of the $Ga_2O_3$ has not reacted.

The third of these processes, described, for example, in *Journal of Crystal Growth*, 19, pp. 204–208 (1979), consists in thermally decomposing a dissolved mixture of the salts (carbonates, nitrates, chlorides, ammonium salts, sulphates, and the like) of the various elements constituting the garnet, and then subjecting the mixture to a heat treatment until the garnet structure is obtained.

The main disadvantage of this third prior art process is that it leads to impure garnets which are contaminated with the impurities resulting from incomplete decomposition reactions (for example, the presence of rare earth oxychlorides).

Furthermore, applicants have developed a process for the manufacture of a polycrystalline mixed oxide having the garnet structure, which overcomes the disadvantages of the earlier processes and exhibits numerous advantages. This process consists in precipitating the co-hydroxides of the cations forming part of the composition of the garnet. This process is described in the commonly assigned, concurrently filed United States application, Ser. No. 204,896, filed Nov. 7, 1980 entitled: "Process for the Manufacture of Polycrystalline Garnet, the Polycrystalline Garnet and the Corresponding Monocrystal". It comprises the following steps:

(1) a solution containing the salts of the constituent cations of the garnet, in the proportions corresponding to the composition of the latter, is prepared;
(2) the corresponding hydroxides are co-precipitated by a base in order to obtain a co-hydroxide;
(3) the co-hydroxide is left to age;
(4) it is filtered off;
(5) it is washed;
(6) it is dried; and
(7) it is then calcined at a temperature above the temperature for the formation of the desired garnet structure.

This process makes it possible to:

(a) obtain the garnet structure by calcination at a lower temperature and for a shorter time than in the processes of the prior art;

(b) obtain the garnet structure outside the enclosure for drawing the monocrystal, which ensures exact knowledge of the composition of the starting polycrystalline garnet by virtue of the possibility of characterizing the latter (for example, by measuring the crystal parameter); and (c) achieve an absolutely complete reaction for the formation of the garnet structure; the polycrystalline garnet obtained is pure and, in particular, it does not contain unreacted oxides.

Thus, during the heating of the polycrystalline garnet in the drawing crucible, the evaporation of the subspecies of certain oxides is much less extensive than in the processes of the prior art. This results in the following additional advantages during the drawing of the monocrystalline garnet:

(a) Exact knowledge of the composition of the molten bath at the moment of drawing obviates the need to use empirical relationships aimed at correcting the various evaporations.

(b) Limitation of the formation of subspecies of certain oxides makes it possible to restrict the reactions of these subspecies with the drawing crucible, and this makes it possible to limit, on the one hand, the attack and the rapid destruction of the crucible, and, on the other hand, inclusions, in the drawn monocrystal, of the metal of which the crucible is made. These last advantages prove to be of considerable practical importance, especially in the particular case of drawing monocrystals of $Gd_3Ga_5O_{12}$ from an iridium crucible.

However, although this process exhibits considerable advantages compared with the processes of the prior art, it does not prove totally satisfactory for obtaining polycrystalline garnets containing aluminium and/or gallium and/or indium and at least one element taken from the group comprising the rare earths and yttrium. In fact, for these garnets, completely quantitative co-precipitation can prove difficult to achieve and the filtration and washing operations can prove lengthy to carry out.

Applicants have invented a novel process for the manufacture of polycrystalline garnets of the foregoing types, which solve the above-mentioned problems, while at the same time, retaining the numerous advantages of the co-precipitation process. This is an important object of the present invention.

It is also an object of the present invention to provide novel processes for the production of polycrystalline garnets and the corresponding monocrystals.

It is a further object of the present invention to provide novel polycrystalline garnets and their corresponding monocrystals.

Other objects will be apparent to those skilled in the art from the present description, taken in conjunction with the appended drawings.

GENERAL DESCRIPTION OF THE INVENTION

Figure 1:
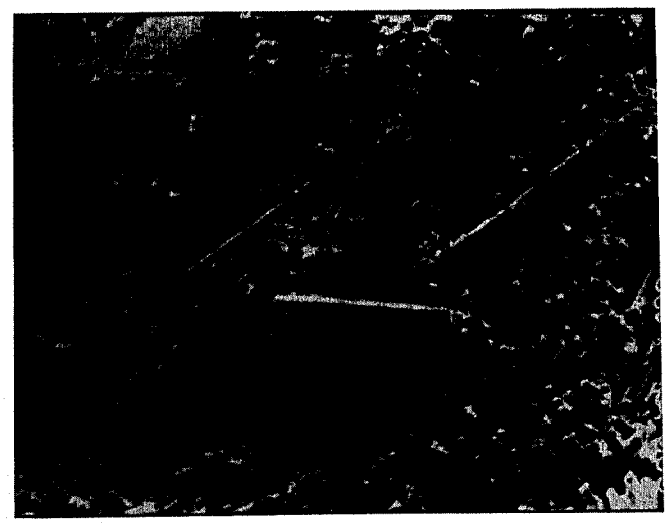
FIG. 1 is a photomicrograph, magnified about 900 times, of a prior art polycrystalline garnet of Comparison Example 3, below.

The present invention comprises a process for the manufacture of a polycrystalline garnet containing aluminium and/or gallium and/or indium, and at least one element taken from the group comprising the rare earths and yttrium, which process comprises:

(1) preparing a solution containing the salts of the constituent cations of the garnet, in the proportions corresponding to the composition of the latter;

(2) the corresponding hydroxides are co-precipitated by means of addition of a base in order to obtain a co-hydroxide, the solution of salts and the base being added simultaneously at a temperature between ambient temperature and the boiling point of the solution of salts, in such a way as to provide a pH of the medium of between about 5 and 10 and that, within these limits, it is kept at a constant value throughout the co-precipitation;

(3) if appropriate, the co-hydroxide is permitted to age;

(4) it is filtered off;

(5) it is washed;

(6) it is dried; and (7) it is then calcined at a temperature above the temperature for the formation of the desired garnet structure.

The present invention also relates to the resulting polycrystalline garnets and to the monocrystals obtained from these polycrystalline garnets, in particular by Czochralski drawing.

The process according to the present invention makes it possible very easily to obtain, on the one hand, exactly the same composition for the garnet as the composition implied by weighing out the starting materials, and, on the other hand, easy and completely effective filtration and washing of the co-hydroxide within a restricted and shortened time.

It will be obvious to those skilled in the art that the process of the present invention applies to the various types of garnets in which the constituent cations can coexist in one and the same pH range, and which have solubilities of less than about $10^{-3}$ mol per liter, the formulae of which garnets can easily be determined from the table given by S. Geller in "Zeitschrift fur Kristallographie," 125, pp. 1–47 (1967), and from the solubility curves of the various hydroxides.

However, the process according to the present invention is particularly suitable for the manufacture of polycrystalline garnets containing aluminium and/or gallium and/or indium and at least one element taken from the group comprising the rare earths and yttrium. These garnets correspond to the general formula $(RE)_3M_5O_{12}$, in which RE represents at least one element taken from the group consisting of the rare earths and yttrium (the rare earths being the elements with the atomic numbers 57 to 71 in the Periodic Classification), and M represents aluminium and/or gallium and/or a combination of aluminium and/or gallium with indium (it being impossible, a priori, for $IN^{3+}$ to occupy the tetrahedral sites of the garnet, according to the above mentioned table of S. Geller). As is well known to those skilled in the art, the regions in which the solid solutions of the garnet structures exist are not always centered on the composition given by the general formula, but they are very slightly displaced relative to the latter. The process according to the invention also embraces the manufacture of these compositions.

The process for the manufacture of a polycrystalline garnet, according to the present invention, comprises a first step for the preparation of a solution containing the salts of the constituent cations of the garnet, in the proportions corresponding to the composition of the latter. These salts can contain an inorganic or organic anion. Solutions of nitrates, chlorides, or sulphates can be used in particular. It is possible for this solution to have been prepared directly by mixing the solutions of salts, in the proportions calculated as a function of the composition of the desired garnet, or alternatively to have been prepared in accordance with the process comprising the following steps:

(a) calcining the oxides of the cations forming part of the composition of the garnet;

(b) weighing the amounts of oxides fixed by the formula of the garnet;

(c) dissolving the oxides in a strong acid; and (d) mixing the resulting solutions of salts.

According to step (a) of this process, the oxides forming part of the composition of the garnet are calcined. The calcination temperature and the calcination time are chosen so that they correspond, for the oxide, to the maximum loss in weight. The chosen calcination conditions must obviously permit the subsequent attack of the calcined oxide in a strong acid medium.

According to step (b) of this process, the amounts of oxides fixed by the formula of the garnet are weighed out. The precision of the weighing is modified in accordance with the precision of the formula of the garnet which it is desired to obtain. Thus, for certain formulae, it may be necessary to operate with a precision of 0.1 percent.

According to step (c) of this process, the oxides are dissolved in a strong acid. The dissolution is carried out separately or, if the conditions of dissolution of these oxides are similar, it is carried out simultaneously. The acid used can be concentrated or dilute. The acid can be chosen, in particular, from among the group comprising: hydrochloric acid, nitric acid, sulphuric acid, and perchloric acid. Hydrochloric acid or nitric acid is advantageously used.

The dissolution conditions vary according to the acids used. The speed of complete dissolution of the oxides depends, in particular, on the nature of the acid, its concentration, and the temperature. Good conditions are generally obtained if the dissolution is carried out with concentrated pure acids at the boiling point. A concentration above about 5 N proves advantageous. The size of the oxide particles is not a critical factor according to the process of the invention. However, if fairly rapid dissolution is desired, it is advantageous to use fairly fine particles, the diameter of which is preferably less than about 400 microns; more particularly, particles having a diameter of between about 1 and 50 microns result in easy processing.

The resulting solutions of salts are mixed if the oxides have been dissolved separately.

In the second step of the process according to the invention, the corresponding hydroxides are co-precipitated by means of a base in order to obtain a co-hydroxide, the solution of salts and the base being added simultaneously at a temperature between ambient temperature and the boiling point of the solution of salts, in such a way that the pH of the medium is between about 5 and 10 and that, within these limits, it is kept at a constant value throughout the co-precipitation.

The co-precipitation is carried out by means of a base and while stirring. A weak base, such as ammonia, urea, hexamethylenetetramine, ammonium carbamate, or the like, will preferably be used as the base. The concentration of the base is preferably above about 5 N.

The co-precipitation is carried out by simultaneously adding the solution of salts and the base at a temperature which is preferably between about 80° C. and the boiling point of the solution of salts and is more particularly between about 95° and 100° C.

The pH of the medium should be between about 5 and 10. A convenient means of starting the co-precipitation under these conditions is to introduce the base and the solution of salts simultaneously into a solution of the salt of the base used and the acid corresponding to the starting salt. Within the pH range in question, the pH must be kept at a constant value throughout the co-precipitation. For the manufacture of polycrystalline garnets containing gallium, the pH value shall preferably be kept constant to within about ±0.05 of a pH unit.

For a given temperature, the pH value to be used is that at which no aluminium hydroxide and/or gallium hydroxide and/or indium hydroxide is redissolved, and at which the precipitation of the rare earth hydroxides and yttrium hydroxide is complete. In other words, for a given temperature, the pH value to be used is that which corresponds to the intended composition of the calcined final garnet, according to the composition curve of the calcined final garnet as a function of the pH for co-precipitation of the hydroxide. In the particular case of the manufacture of a gadolinium gallium garnet $Gd_3Ga_5O_{12}$, this value is $6.50\pm0.05$, if the co-precipitation is carried out under the preferred conditions, namely, at a temperature between about 95° and 100° C., and $8.10\pm0.05$ if the co-precipitation is carried out at a temperature between about 20° and 25° C.

In the third step of the process according to the invention, the co-hydroxide obtained is left to age for a period of between about 1 and 20 hours. If the precipitation of the co-hydroxide is complete, this aging step can optionally be omitted. The aging is advantageously carried out under the same temperature and pH conditions as the precipitation. In the particular case of the manufacture of a gadolinium gallium garnet $Gd_3Ga_5O_{12}$, the aging is preferably carried out at about 95° to 100° C. and at a pH of $6.50\pm0.05$.

In the fourth step of the process of the invention, the filtration of the co-hydroxide obtained is carried out under pressure or in vacuo. The filtering element used must preferably have a very small pore size of the order of about 1 to 5 microns. As is well known to those skilled in the art, the co-hydroxide can be rendered filterable by adding to the precipitate, before or after aging, a flocculant or flocculating agent which is decomposable at low temperature.

In the fifth step of the process of the invention, the co-hydroxide is then washed. The washing is preferably carried out with water until the wash waters obtained have a pH in the region of neutrality. The purpose of this washing is essentially to remove the adsorbed salts; it can be carried out, in particular, either by passing a certain volume of water through co-hydroxide cake or by resuspending the filter cake.

The process according to the present invention thus makes it possible to reduce, by a factor of about 6, the time required for the filtration and washing operations when using conventional co-precipitation of the hydroxides at ambient temperature by adding the solution of salts to the base.

In the sixth step of the process of the invention, the co-hydroxide is then dried in air or in vacuo at temperatures between about 100° C. and 200° C., for about 10 to 48 hours. This drying is preferably carried out in an oven at a temperature between about 110° and 150° C., for a period of between about 10 and 30 hours.

In the seventh step of the process of the invention, the dried product is calcined at a temperature above the temperature for the formation of the structure of the garnet in question.

For a given garnet, the calcination temperature and the calcination time depend, on the one hand, on the temperature for the formation of the garnet structure from the co-hydroxide, this temperature being determined without difficulty, by those skilled in the art, from the differential thermal analysis curves obtained on the dried product, and, on the other hand, on the conditions of the subsequent use of the calcined polycrystalline garnet. Under these conditions, a calcination temperature between about 800° and 1500° C. and a time of between 1 and 30 hours are generally suitable. The calcination is generally carried out under air or under an inert atmosphere.

The polycrystalline garnet obtained can be characterized by X-ray diffraction; it is possible to verify its garnet structure, check its homogeneity by verifying that no other structure is visible (in particular, no unreacted oxides are detected), and to measure its lattice parameter.

Exact knowledge of the composition of the polycrystalline garnet is one of the advantages of the process according to the invention during the subsequent drawing of the monocrystal.

Furthermore, scanning electron microscopy reveals the existence of elementary crystals having dimensions of the order of a few microns. These crystals can agglomerate to give a compact assembly.

The specific surface area of the polycrystalline garnet obtained in accordance with the process of the present invention is generally low, and its density is generally between about 6 and 7 grams per milliliter.

The present invention also relates to the monocrystals obtained from the polycrystalline garnets manufactured in accordance with the process described above. The monocrystals of garnet can be manufactured, in particular, using the known technique of Czochralski crystal drawing.

The monocrystals, having the garnet structure, obtained from the polycrystalline garnets of the invention, can be used in all the fields in which these materials are of value, in particular, in electronics such as substrates for the manufacture of magnetic bubble memory devices.

The very numerous advantages of the invention, as regards both the polycrystalline garnet and the drawing of the monocrystal, are in accordance with the present disclosure.

SPECIFIC DESCRIPTION OF THE INVENTION

In order to disclose more clearly the nature of the present invention, the following examples illustrating the invention are given. It should be understood, however, that this is done solely by way of example and is intended neither to delineate the scope of the invention nor limit the ambit of the appended claims. In the examples which follow, and throughout the specification, the quantities of material are expressed in terms of parts by weight, unless otherwise specified.

EXAMPLE 1

This example illustrates the preparation of the polycrystalline gallium gadolinium garnet in accordance with the process of the invention. The stoichiometric composition of this garnet is $Gd_{3.00}Ga_{5.00}O_{12}$ and a solid solution of the garnet structure exists which is not centered on this composition but is displaced towards the gadolinium-rich compositions. More particularly, the congruent-melt composition (approximately $Gd_{3.04}Ga_{4.96}O_{12}$) is different from the stoichiometric composition and it is preferable, under these conditions, if it is desired to draw the monocrystalline garnet by the Czochralski method, to start from a polycrystalline garnet of which the composition is between the congruent and stoichiometric compositions.

This example describes the preparation of the polycrystalline garnet having the composition $Gd_{3.01}Ga_{4.99}O_{12}$. The process of the example was carried out according to the following steps:

(1a) gadolinium oxide, $Gd_2O_3$, and gallium oxide, $Ga_2O_3$, were calcined for 15 hours at 1200° C.;

(1b) 11,347.6 grams of calcined $Gd_2O_3$ and 9,727.4 grams of calcined $Gd_2O_3$ were each weighed out;

(1c) the gadolinium oxide was dissolved in 34 liters of 6.4 N nitric acid in a 100-liter Pyrex reactor fitted with a stirrer coated with polytetrafluoroethylene (PTFE). Dissolution was rapid and exothermic and was carried out with a 1 square meter condenser under total reflux.

The gallium oxide was dissolved in 64 liters of 6.4 N nitric acid in a heated 100-liter Pyrex reactor fitted with a PTFE-coated stirrer. Complete dissolution at 100° C. under total reflux (1 $m.^2$ condenser) lasted over 8 hours;

(1d) the two resulting nitrate solutions were mixed and homogenized in a 120-liter polypropylene vat;

(2) the mixed gallium and gadolinium hydroxides were co-precipitated in two 200-liter Pyrex reactors which were each fitted with a PTFE-coated stirrer, a pH measuring probe and a temperature probe, and are each fed by means of two metering pumps.

The experimental conditions of the co-precipitation were as follows:

(a) the temperature was between 20° and 25° C.;

(b) the two reactors having been filled beforehand with 30 liters of a solution of ammonium nitrate, $NH_4NO_3$, the solution of gallium nitrate and gadolinium nitrate and a 6 N ammonia solution were introduced simultaneously into each of the two reactors. In each of the two reactors, the output of the two metering pumps for introducing the reactants was controlled by the regulation of the pH to the nominal value of $8.10 \pm 0.05$;

(c) the average flow rate of the solution of nitrates was 10 liters per hour; the total duration of the co-precipitation in the two reactors was thus about 5 hours;

(d) the volume of ammonia used was 105 liters; and (e) 5 liters of a 0.1 percent strength aqueous solution of the flocculant Flocogil AD 10 (registered trademark), a modified polyacrylamide; were added to each reactor;

(3) the gallium and gadolinium co-hydroxide was left to age for 15 hours at ambient temperature at a pH of between 8.0 and 8.2, while stirring;

(4) the co-hydroxides were filtered off in vacuo on a suction-type filter of diameter 140 cm.; the filtering element was a polypropylene gauze with a pore size of about 3 microns. The thickness of the filter cake obtained for one reactor was 40 mm.;

(5) the cake from each reactor was washed separately by passing 5 times 50 liters of water through the cake;

(6) the cake was dried in an oven in vacuo for 15 hours at 130° C. The loss in weight of the cake was about 75 percent; and (7) the product obtained after breaking up the cake was calcined for 5 hours at 1350° C., under argon, in crucibles made of sintered alumina of high purity. The calcination temperature used was very much higher than the temperature for the formation of the garnet structure from the co-hydroxides, which was 820° C. (determined from the differential thermal analysis curve), but proves advantageous in giving a polycrystalline garnet which was directly fusible during Czochralski drawing, without any other treatment.

The loss in weight during the calcination was 18.2 percent, and 20,320 grams of polycrystalline garnet were obtained with a yield of 96 percent.

Characterization of the resulting product by X-ray diffraction revealed that only the garnet structure was visible (no $Ga_2O_3$ structure and/or $Gd_2O_3$ structure).

Measurement of the lattice parameter gave a=12.378 Å, which corresponds well to the desired composition, namely, $Gd_{3.01}Ga_{4.99}O_{12}$.

The monocrystal obtained from this polycrystalline garnet by Czochralski drawing was absolutely perfect. The drawing was carried out with all the advantages given in the present disclosure.

EXAMPLE 2

This example relates to the preparation of the garnet $Gd_{3.01}Ga_{4.99}O_{12}$ under the preferred conditions of the process according to the invention.

Steps (1a) to (1d) were identical to those given in Example 1, above;

(2) the co-precipitation step was carried out in the same two reactors as in Example 1, the experimental conditions of the co-precipitation being as follows:

the temperature was 100° C. with total reflux;

the two reactors having been filled beforehand with 30 liters of a solution of ammonium nitrate, $NH_4NO_3$, the solution of gallium nitrate and gadolinium nitrate and a 6 N ammonia solution were introduced simultaneously into each of the two reactors. In each of the two reactors, the output of the two metering pumps for introducing the reactants was controlled by the regulation of the pH to the nominal value of 6.50±0.05;

the average flow rate of the solution of nitrates was 13 liters per hour, the total duration of the co-precipitation in the two reactors thus being about 4 hours; and the volume of ammonia used was 104 liters;

(3) the gallium/gadolinium co-hydroxide was left to age for 4 hours at 100° C. at a pH of between 6.40 and 6.60, while stirring;

(4) the co-hydroxide was filtered off hot, in vacuo, on a suction-type filter of diameter 140 cm. The filtering element was a polypropylene gauze having a pore size of about 3 microns. Filtration was much easier than in Example 1, above, and the total amount of co-hydroxide from the two reactors was easily filtered off in a single operation;

(5) the filter cake was washed by passing 5 times 100 liters of water through the cake.

For equal amounts of co-hydroxide treated, the filtration and washing operations were twice as rapid as those carried out in accordance with Example 1;

(6) the cake was dried in an oven in vacuo for 15 hours at 130° C. The loss in weight of the cake was about 75 percent; and (7) the product obtained after breaking up the cake was calcined for 5 hours at 1350° C., and 20,300 grams of polycrystalline garnet were obtained with a yield of more than 96 percent.

The characteristics of the polycrystalline garnet and the properties of the monocrystal obtained are identical to those given in Example 1.

EXAMPLE 3: COMPARISON EXAMPLE

This example illustrates one of the advantages of the process according to the invention, compared with the process of the prior art which is commonly used for the preparation of polycrystalline garnets.

The polycrystalline garnet having the composition $Gd_{3.01}Ga_{4.99}O_{12}$ was prepared in accordance with the following steps:

1. Gadolinium oxide, $Gd_2O_3$, was calcined for 15 hours at 1200° C. and gallium oxide, $Ga_2O_3$, was calcined for 15 hours at 1200° C.

2. 11,347.6 grams of calcined $Gd_2O_3$ and 9,727.4 grams of calcined $Ga_2O_3$ were weighed out.

3. These oxides were mixed and then calcined for 100 hours at 1350° C. This yielded a polycrystalline garnet in which 10 percent by weight of the $Ga_2O_3$ had not reacted. Analysis of this product by scanning electron microscopy revealed the existence of acicular crystals of unreacted $Ga_2O_3$; the photomicrograph (magnified 900 times) given in FIG. 1 of the drawings illustrates a product of this type.

Figure 2:
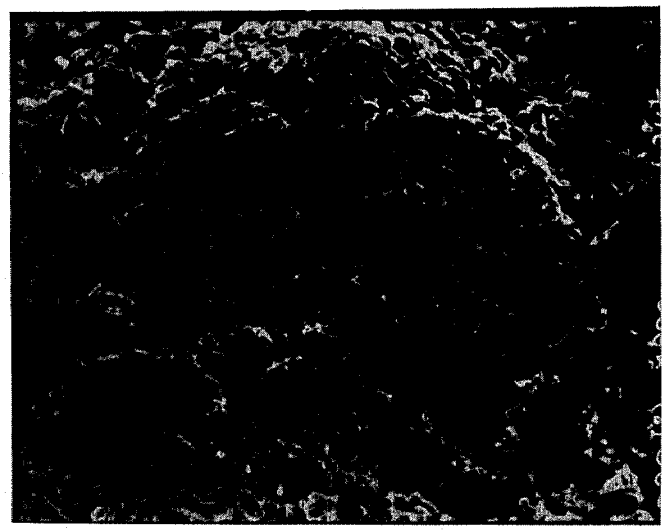
FIGS. 2, 3, and 4 are photomicrographs of the polycrystalline garnets of the present invention produced in accordance with Examples 1 and 2, below, magnified about 900 times.
Figure 3:
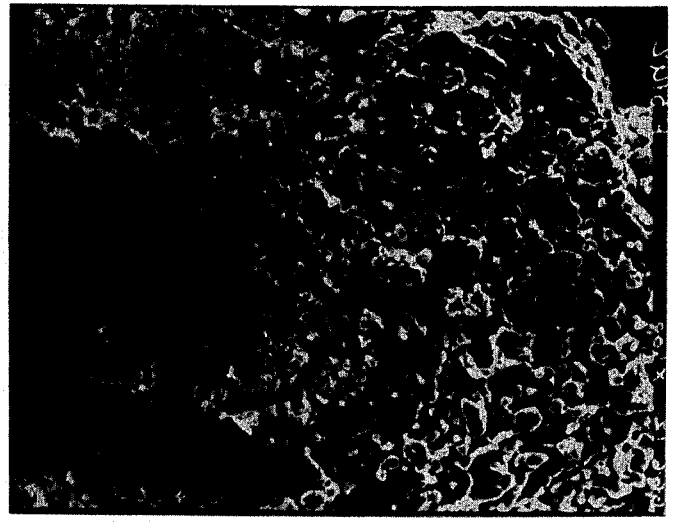
Figure 4:
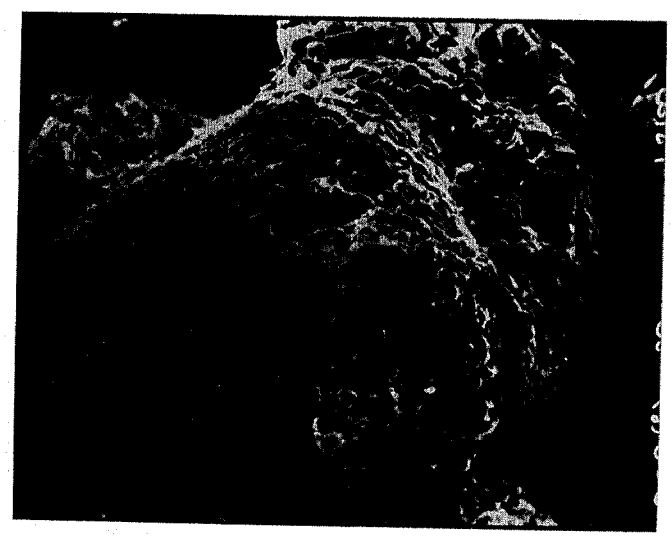

By comparison, the polycrystalline garnets obtained in accordance with the process of the invention, described in Examples 1 and 2, above, are shown to possess a structure without inclusions. Photomicrographs (magnified 900 times) of these garnets which were obtained by scanning electron microscopy are given in FIGS. 2, 3, and 4 of the appended drawings.

EXAMPLE 4: COMPARISON EXAMPLE

This example illustrates one of the advantages gained by the process of the invention, compared with the general co-precipitation in which the solution of nitrates is added to the ammonia until a determined pH is reached.

Steps (1a) to (1d) were identical to those given in Example 1, above;

(2) the co-precipitation step was carried out in the same reactors as in Example 1; the experimental conditions were as follows:

(a) the temperature was 20°–25° C.; and (b) the solution of gallium nitrate and gadolinium nitrate was added to a 6 N ammonia solution until a pH of 8.70 was obtained; and (3) the co-hydroxide obtained was left to age for 3 hours at ambient temperature, while stirring.

The filtration, washing, drying, and calcination operations were substantially those given in Example 1, above.

The duration of the filtration and washing operations was about 6 times longer than those carried out in accordance with Example 2, above.

Furthermore, a high precision regarding the composition of the final garnet can be achieved more easily with the process according to the invention than with the general process which has been illustrated above in this comparison example.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed.

What is claimed is:

1. A process for manufacturing a pure polycrystalline garnet consisting essentially of aluminium and/or gallium and/or indium, oxygen and at least one element taken from the group consisting of the rare earths and yttrium, which process comprises the following steps:

(1) a solution is prepared consisting essentially of the salts of the constituent cations of the garnet, in the proportions corresponding to the composition of the desired garnet structure;

(2) the corresponding hydroxides are co-precipitated by means of a base in order to obtain a co-hydroxide, the solution of salts and the base being added simultaneously at a temperature between ambient temperature and the boiling point of the solution of salts so that the pH of the medium is between about 5 and 10 and the pH is kept at a constant value, within these limits, throughout the co-precipitation, said constant pH value being that at which no aluminum hydroxide and/or gallium hydroxide and/or indium hydroxide is redissolved, and at which the precipitation of the rare earth hydroxides and yttrium hydroxide is complete;

(3) the co-hydroxide is filtered off;
(4) the co-hydroxide is washed;
(5) the co-hydroxide is dried; and
(6) the co-hydroxide is then subjected to a single calcination at a temperature between about 800° C. and 1500° C. until completely reacted, whereby said pure polycrystalline garnet is produced.

2. A process according to claim 1, wherein the co-hydroxide subsequent to step (2) is permitted to age before filtering it off in step (3).

3. A process according to claim 2, wherein the aging is carried out under the same temperature and pH conditions as during the co-precipitation step, for about 1 to 20 hours.

4. A process according to claim 1, wherein, in step (1), the salts are chosen from among the group consisting of nitrates, chlorides, and sulphates.

5. A process according to claim 1, wherein, in step (1), the solution containing the salts of the constituent cations of the garnet is prepared in accordance with the process comprising the following steps:
(a) the oxides of the cations forming part of the composition of the garnet are calcined;
(b) the amounts of oxides fixed by the formula of the garnet are weighed;
(c) each oxide is dissolved in an acid; and
(d) the resulting solutions of salts are mixed.

6. A process according to claim 4, wherein, in step (c), the acid is a strong acid.

7. A process according to claim 4, wherein the oxides are dissolved simultaneously in a strong acid.

8. A process according to claim 4 wherein the acid is chosen from among the group consisting of hydrochloric acid, nitric acid, sulphuric acid, and perchloric acid.

9. A process according to claim 8, wherein the dissolution is carried out with pure concentrated acid at the boiling point.

10. A process according to claim 1, wherein, in step (2), the base is a weak base which is chosen from among the group consisting of ammonia, urea, hexamethylenetetramine and ammonium carbamate.

11. A process according to claim 1, wherein, in step (2), the concentration of the base is above about 5 N.

12. A process according to claim 1, wherein, in step (2), the temperature is between about 80° C. and the boiling point of the solution of salts.

13. A process according to claim 1, wherein, in step (2), the temperature is between about 95° C. and 100° C.

14. A process according to claim 1, wherein, in step (3), the co-hydroxide is filtered off under pressure or in vacuo, the filtering element used preferably having a pore size of about 1 to 5 microns.

15. A process according to claim 1, wherein, in step (4), the co-hydroxide is washed with water until the wash waters obtained have a pH in the region of neutrality.

16. A process according to claim 1, wherein, in step (5), the co-hydroxide is dried in air or in vacuo at a temperature between about 100° C. and 200° C. for about 10 to 48 hours.

17. A process according to claim 1, wherein, in step (6), the co-hydroxide is calcined for about 1 to 30 hours.

18. A polycrystalline garnet obtained in accordance with the process of any one of the preceding claims, wherein it consists of crystals, the elementary dimensions of which are of the order of a few microns, and which are agglomerated to give a compact assembly.

19. A monocrystal obtained by a drawing process from the polycrystalline garnet manufactured in accordance with the process of claim 1, 2, 4, 5, 6, 7, 8, 9, 10, 11, 12, 13, 3, 14, 15, 16 or 17.

20. A monocrystal according to claim 19 wherein the drawing process is a Czochralski drawing process.

* * * * *